(12) United States Patent
Godfroy et al.

(10) Patent No.: US 7,983,041 B2
(45) Date of Patent: Jul. 19, 2011

(54) ELECTRIC MODULE

(75) Inventors: Guillaume Godfroy, Versailles (FR); Nicolas Lapassat, Villebon-sur-Yvette (FR)

(73) Assignee: Converteam Technology Ltd., Warwickshire (GB)

( * ) Notice: Subject to any disclaimer, the term of this patent is extended or adjusted under 35 U.S.C. 154(b) by 0 days.

(21) Appl. No.: 12/661,647

(22) Filed: Mar. 22, 2010

(65) Prior Publication Data

US 2010/0254087 A1    Oct. 7, 2010

(30) Foreign Application Priority Data

Mar. 23, 2009    (FR) ...................................... 09 51822

(51) Int. Cl.
*H05K 7/20*          (2006.01)
(52) U.S. Cl. ........ 361/699; 361/688; 361/690; 361/695; 165/104.33
(58) Field of Classification Search ........................ None
See application file for complete search history.

(56) References Cited

U.S. PATENT DOCUMENTS

| | | | | |
|---|---|---|---|---|
| 5,907,473 A | * | 5/1999 | Przilas et al. | 361/699 |
| 6,019,167 A | * | 2/2000 | Bishop et al. | 165/104.33 |
| 6,145,584 A | * | 11/2000 | Baynes et al. | 165/45 |
| 6,954,405 B2 | * | 10/2005 | Polany et al. | 367/131 |
| 7,307,841 B2 | * | 12/2007 | Berlin et al. | 361/699 |

FOREIGN PATENT DOCUMENTS

| | | |
|---|---|---|
| GB | 2 342 713 | 4/2000 |
| WO | WO-A2-98/13838 | 4/1998 |
| WO | WO 01/13692 | 2/2001 |

* cited by examiner

*Primary Examiner* — Boris L Chervinsky
(74) *Attorney, Agent, or Firm* — Davidson, Davidson & Kappel, LLC

(57) ABSTRACT

The electric module includes a sealed enclosure (104), at least one item of electrical equipment (106) arranged in the sealed enclosure (104) and which, in operation, heats the atmosphere, and a secondary cooling circuit. The secondary circuit includes a guiding channel (108) arranged in the sealed enclosure (104) so as to guide the atmosphere which has been heated by the item or items of electrical equipment (106) towards its top opening (108B), and a passage (109) for the atmosphere delimited, at least partly, by the sealed enclosure (104) in order to enable a cooling of the atmosphere upon contact with the sealed enclosure (104). The guiding channel (108) is thermally isolated from the sealed enclosure (104).

21 Claims, 1 Drawing Sheet

ELECTRIC MODULE

This claims the benefits of French Patent Application FR 09 51822, filed Mar. 23, 2009, and hereby incorporated by reference herein.

The present invention relates to an electric module intended to be submerged underwater, in particular, an electric module intended to be submerged under the sea.

BACKGROUND

Document WO-A2-98/13838 describes an electric module intended to be submerged underwater, of the type comprising:

a sealed enclosure intended to be submerged underwater and containing an atmosphere comprising a heat transfer fluid, referred to as the secondary fluid, for example air or nitrogen;

at least one item of electrical equipment arranged in the sealed enclosure and which, in operation, heats the atmosphere, a first cooling circuit, referred to as the secondary circuit, for cooling the item or items of electrical equipment, using the secondary fluid, the secondary circuit comprising:

a guiding channel provided with two openings, one, referred to as the bottom opening, being arranged beneath the other, referred to as the top opening, in a position of use of the electric module, the guiding channel being arranged in the sealed enclosure so as to guide the atmosphere which has been heated by the item or items of electrical equipment towards its top opening;

a passage for the atmosphere, the passage linking the top opening to the bottom opening via the outside of the guiding channel and being delimited, at least partly, by the sealed enclosure in order to provide a cooling of the atmosphere upon contact with the sealed enclosure;

In this document, the guiding channel is fixed to the sealed enclosure by a multitude of thermally conductive fins distributed along the circumference of the sealed enclosure.

Moreover, for obvious reasons of operation, it is desirable for the environment of the item or items of electrical equipment to be as dry as possible.

To this end, there exist, first of all, active dehumidifying systems. However, these systems are not reliable enough for undersea use, in particular at depths of greater than 500 meters, at which any repair operation is very difficult.

Passive systems also exist, such as silica gel beads. However, they are not effective enough.

SUMMARY OF THE INVENTION

It is an object of the present invention to provide an electric module intended to be submerged underwater, and enabling a dry environment to be maintained, in a reliable and effective manner, around the electrical equipment.

The present invention provides an electric module intended to be submerged underwater, of the abovementioned type, whereby the guiding channel is thermally isolated from the sealed enclosure.

Specifically, the inventors have observed that by thermally isolating the guiding channel from the sealed enclosure, the guiding channel could remain at a high temperature such that the risk of condensation on this channel is markedly reduced. Thus, in comparison with the above document, the invention provides for preventing the guiding channel from being cooled by the sealed enclosure due to the thermally conductive fins, and prevents condensation being created inside the guiding channel and consequently near the electrical equipment.

According to other embodiments, the electric module comprises one or more of the following features, taken alone or in accordance with any technically possible combination:

the electric module comprises thermal conduction insulators, linking the guiding channel to the sealed enclosure, the thermal conduction insulators having a thermal conductivity of less than or equal to $1 \text{ W·m}-1\text{·K}-1$, the thermal exchanges by conduction between the guiding channel and the sealed enclosure taking place only by means of the thermal conduction insulators;

the guiding channel is thermally isolated from the sealed enclosure such that, under conditions of use of the electric module, the guiding channel is at a temperature higher by 5° C. than that of the sealed enclosure;

the thermal conduction insulators comprise fastening means intended to fix the guiding channel to the sealed enclosure;

the thermal conduction insulators are formed only by fastening means;

the item or items of electrical equipment are of a power level higher than 10 kVA, preferably higher than 1 MVA;

at least one item of electrical power equipment is arranged in the guiding channel, between the top opening and the bottom opening;

all the items of electrical power equipment are arranged in the guiding channel, between the top opening and the bottom opening;

the electric module comprises a second cooling circuit, referred to as the primary circuit, for cooling the item or items of electrical equipment, using a second fluid, referred to as the primary fluid, for example water;

the sealed enclosure has a bottom intended to collect the primary fluid in liquid form, which would have escaped from the primary circuit and condensed on the enclosure, and the electric module comprises a pump intended to retrieve the primary fluid accumulated at the bottom of the sealed enclosure and to re-inject this primary fluid into the primary circuit;

the electric module comprises a bottom roof covering the bottom of the sealed enclosure, and this bottom roof is thermally linked to the sealed enclosure;

the primary fluid is conductive when it has escaped into the atmosphere;

the primary fluid has a resistivity of less than 1 MΩ·cm when it has escaped into the atmosphere;

the electric module comprises a non-return system, for example a check valve and/or a solenoid valve, arranged between the pump and the primary circuit and intended to prevent a flow of the primary fluid from the primary circuit towards the pump;

the electric module comprises a heating system, for example based on electrical resistance, intended to heat the atmosphere in the guiding channel, at least intermittently;

the electric module comprises a moisture sensor intended to supply a measurement of moisture in the guiding channel, and the heating system is intended to stop heating when the measurement passes below a predetermined thieshold, and otherwise it is intended to give out heat;

the heating system is intended to give out heat upon startup or restart of the item or items of electrical equipment;

the heating system is arranged in the bottom half of the guiding channel, and, preferably, in the bottom opening of the guiding channel;

the sealed enclosure delimits a convex volume;

the guiding channel lacks an opening other than the top and bottom openings;

the guiding channel is cylindrical;

the electric module comprises condensation fall prevention means intended to prevent a falling of condensation from a part of the sealed enclosure located vertically from the item or items of electrical equipment in a position of use of the electric module, onto the item or items of electrical equipment;

the condensation fall prevention means comprise a thermal insulation layer extending on the part located vertically from the item or items of electrical equipment, and intended to prevent the formation of condensation on this part;

the condensation fall prevention means comprise a top roof covering the top opening;

the item or items of electrical equipment comprise a power converter.

BRIEF DESCRIPTION OF THE DRAWINGS

These features, and others, will become clear from the following description of an embodiment of the invention, given purely by way of example and with reference to the accompanying drawings in which.

DETAILED DESCRIPTION

Figures 1, 2:
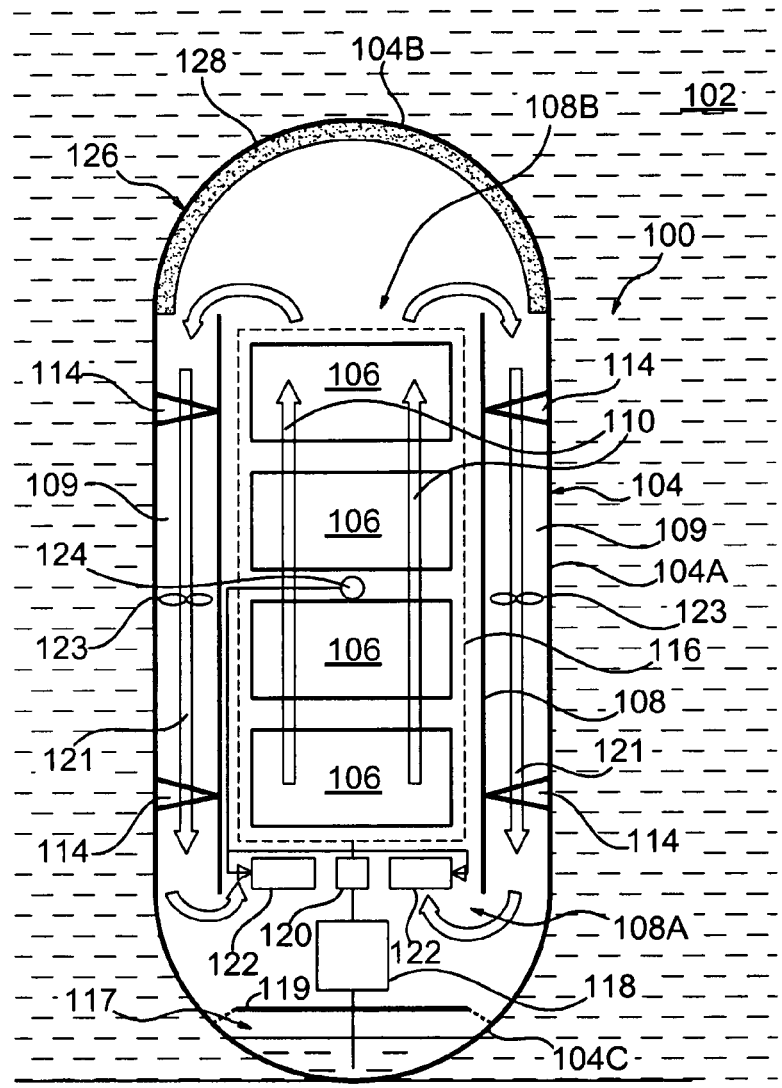
FIG. 1 represents a side cutaway view of an electric module according to the invention.
FIG. 2 is a side cutaway view of a top part of the module of FIG. 1 according to a variant embodiment.

An electric module, denoted by the general reference 100, represented in FIG. 1 in a position of use, is submerged in water 102. In the example described, the electric module 100 is submerged in seawater, at a depth of greater than 800 meters, preferably at a depth of greater than 1000 meters. Preferably, the electric module 100 rests on the sea bed.

The electric module 100 comprises a sealed enclosure 104. The sealed enclosure 104 is totally submerged in the water 102 and is in contact with the water 102. The sealed enclosure 104 contains an atmosphere comprising a heat transfer fluid, called the secondary fluid to distinguish it from the primary fluid which will be described later, for example air or nitrogen. Preferably, when the electric module 100 is placed in operation, the atmosphere is formed almost exclusively by the secondary fluid. The atmosphere can also contain water, and hence be humid.

The sealed enclosure 104 comprises a cylindrical central part 104A with circular cross-section and cup-shaped end parts 104B, 104C closing the cylindrical central part 104A. In a position of use of the electric module 100, the sealed enclosure 104 is intended to be extended with the central part 104A vertical, with one 104B of the end parts located above and the other 104C of the end parts located beneath. The sealed enclosure 104 delimits a general convex volume, in particular not comprising any recess delimiting an advance of the water 102 towards the inside of the electric module 100.

The electric module 100 comprises at least one item of electrical equipment 106. In the example described, the electric module 100 comprises several electrical devices (all bearing the same reference 106) arranged in the sealed enclosure 104. The item or items of electrical equipment 106 are preferably electrical power equipment, i.e. of a power level higher than 10 kVA. An example is an electrical power converter. In operation, each item of electrical equipment 106 releases heat and hence heats the atmosphere surrounding it.

The electric module 100 additionally comprises a guiding channel 108 for guiding the heated atmosphere. In the example described, the guiding channel 108 has a cylindrical shape of hexagonal cross-section, and extends vertically. The guiding channel 108 is provided with two openings 108A, 108B; one, referred to as the bottom opening 108A, is arranged beneath the other opening 108B, referred to as the top opening 108B. In the example described, the guiding channel 108 is arranged in the sealed enclosure 104 in such a way as to surround all the items of electrical power equipment 106. Thus, all the items of electrical equipment 106 are located in the guiding channel 108, between its top opening 108B and its bottom opening 108A. By virtue of its arrangement, the guiding channel 108 can guide the atmosphere which has been heated by the item or items of electrical equipment 106 towards its top opening 108B, by a phenomenon of convection. This guiding effect is represented by the arrows 110.

The electric module 100 additionally comprises thermal conduction insulators 114, linking the guiding channel 108 to the sealed enclosure 104. The thermal conduction insulators 114 have a thermal conductivity of less than or equal to 1 $W \cdot m^{-1} \cdot K^{-1}$. Moreover, the thermal exchanges by conduction between the guiding channel 108 and the sealed enclosure 104 take place only by means of the thermal conduction insulators 114. In the example described, the thermal conduction insulators 114 are formed only by fastening means intended to fix the guiding channel 108 to the sealed enclosure 104. In the example described, the fastening means 114 are attachment arms that are substantially horizontal in the position of use of the electric module 100. By virtue of the thermal insulators, a significant temperature difference can be maintained between the guiding channel 108 and the sealed enclosure 104, generally a difference of at least 5° C., and preferably between 15° C. and 30° C. In the example described, the temperature of the sealed enclosure is between 10° C. and 15° C., for example 13° C., while the temperature of the guiding channel 108 and of the heat transfer fluid flowing in this guiding channel 108 is between 30° C. and 45° C., for example between 35° C. and 40° C.

The guiding channel 108 extends at a distance from the sealed enclosure 104 such that the space separating them forms a passage 109 for the atmosphere, the passage 109 linking the top opening 108B to the bottom opening 108A via the outside of the guiding channel 108. The passage 109 is delimited, at least partly, by the sealed enclosure 104.

Thus, the hot atmosphere leaving the top opening 108B meets the bottom opening 108A by flowing through the passage 109. When it is flowing through the passage 109, the atmosphere is cooled upon contact with the sealed enclosure 104 and the water contained in the atmosphere condenses on the sealed enclosure 104. The flow through the passage 109 is illustrated by the arrows 121.

Optionally, it is possible to encourage the flow of heat transfer fluid using fans 123 arranged in the passage 109 (as illustrated) and/or in the guiding channel 108.

Thus, the guiding channel 108 and the passage 109 form a cooling circuit, called the secondary circuit to distinguish it from the cooling circuit 116 which will be described later, for cooling the electrical equipment, using the secondary fluid.

Additionally, the moisture in the atmosphere is kept outside the guiding channel 108 by the action of it condensing on the sealed enclosure 104, and hence the moisture is kept at a distance from the item or items of electrical equipment 106.

The guiding channel 108, thermally isolated from the sealed enclosure 104, and the passage 109 thus form a dehumidifier of the environment of the item or items of electrical equipment 106. Preferably, this device provides for having a relative humidity RH in the guiding channel 108 of between 5% and 85% as laid down by the standard IEC 60721-3-3, class 3K3.

The electric module 100 additionally comprises a cooling circuit 116 for cooling the item or items of electrical equipment 106, this cooling circuit 116, referred to as the primary circuit, using a heat transfer fluid, referred to as the primary fluid, for example water. The primary circuit 116 transports the primary fluid between the item or items of electrical equipment 106 (forming a heat source) and a heat sink, for example the sealed enclosure 104 or the water 102. Generally, the primary circuit provides for dissipating between 80% and 95% of the heat generated by the item or items of electrical equipment, the remaining 20% to 5% being dissipated by the secondary circuit.

Sometimes a part of the primary fluid escapes from the primary circuit 116, for example due to leaks. Thus, the atmosphere comprises, in addition to the secondary fluid and the original moisture, a fraction of primary fluid.

The presence of primary fluid in the atmosphere of the sealed enclosure poses two problems.

First, the quantity of primary fluid present in the primary circuit 116 reduces, thereby running the risk of degrading the operation of the primary circuit 116 and/or reducing its life. Moreover, sometimes the primary fluid is conductive in the atmosphere, for example by having a resistivity of less than 1 MΩ·cm.

In the case of water as the primary fluid, it is possible to provide a de-ionization system in the primary circuit, making the water dielectric in the primary circuit. Nevertheless, once in the atmosphere, the water can become re-ionized to have a resistivity of less than 1 MΩ·cm. In other embodiments, a conductive primary fluid (resistivity of less than 1 MΩ·cm) could be used directly in the primary fluid.

In any case, once in the atmosphere, this primary fluid risks endangering the items of electrical equipment 106 in the same way as the original moisture. The dehumidifying function of the guiding channel 108, thermally isolated from the sealed enclosure 104, and of the passage 109, provides for keeping the primary fluid that has escaped from the primary circuit 116 outside the guiding channel 108, by the action of it condensing on the cold sealed enclosure 104.

The lower part 104C of the enclosure forms a bottom 117 intended to collect the condensation, in particular of the primary fluid, which could form on the sealed enclosure 104 when the atmosphere is passing through the passage 109.

The bottom 117 thus provides for retrieving the primary fluid which would have leaked from the primary circuit 116, and which would be mixed with the secondary fluid in the atmosphere of the sealed enclosure 104.

The electric module 100 additionally comprises a bottom roof 119 covering the bottom 117 of the sealed enclosure 104. This bottom roof 119 is thermally linked to the sealed enclosure 104. The thermal connections with the sealed enclosure 104 are represented in dotted line in FIG. 1. The bottom roof 119 is thus at a temperature close to that of the sealed enclosure 104. The bottom roof 119 is intended to prevent the primary fluid accumulated in the bottom 117 of the sealed enclosure 104 from returning to the atmosphere by evaporation. Specifically, the primary fluid vapours condense upon contact with the bottom roof 119 and return to the bottom 117.

The electric module 100 additionally comprises a pump 118 intended to retrieve the primary fluid accumulated in liquid form at the bottom 117 of the sealed enclosure 104, and to re-inject this primary fluid into the cooling circuit 116. It is thus possible to increase the life of the cooling circuit 116.

A "simple" pump, i.e. without the filtering means described later, is sufficient when the primary fluid is water (glycolated or non-glycolated), such that it is tolerable for the original moisture to be retrieved at the same time as the condensed primary fluid and injected into the primary cooling circuit, or when the primary fluid is not water but there is no moisture initially in the enclosure. However, when the primary fluid is not water and when the enclosure contains moisture initially, the pump preferably comprises filtering means intended to prevent the moisture retrieved at the same time as the condensed primary fluid from being injected into the primary cooling circuit.

The electric module 100 additionally comprises a non-return system 120, for example a check valve and/or a solenoid valve, arranged between the pump 118 and the cooling circuit 116 and intended to prevent a flow of the primary fluid from the primary circuit 116 towards the pump 118. Thus, in the event of a failure of the pump 118, the non-return system 120 prevents the primary fluid from being discharged from the primary circuit 116 through the pump 118 that is off.

The electric module 100 additionally comprises a heating system 122, for example based on electrical resistance, intended to heat the heat transfer fluid in the guiding channel 108, when the item or items of electrical equipment 106 are being started up.

Specifically, upon startup or restart of the item or items of electrical equipment 106, the latter do not generally release enough heat to enable the heat transfer fluid to start flowing towards the opening 108B. The heating system 122 enables this flowing effect to start.

Preferably, the heating system 122 is arranged in the bottom half of the guiding channel 108, and, still preferably, in the bottom opening 108A of the guiding channel.

In order that the heating system 122 is used only when necessary, the electric module 100 comprises a moisture sensor 124 intended to supply a measurement of moisture in the guiding channel 108. The heating system 122 is then intended to stop heating when the measurement produced by the moisture sensor 124 passes below a predetermined threshold.

The electric module 100 additionally comprises means 126 to prevent drops of condensation from falling onto the electrical equipment 106. In the example of FIG. 1, these means 126 comprise a thermal insulation layer 128 extending on the top part 104B of the sealed enclosure 104, at least vertically above the opening 108B, and on which condensation does not form.

As a variant represented in FIG. 2, the means 126 comprise a roof 130 covering the top opening 108B and preventing condensation formed on the top part 104B of the sealed enclosure 104, vertically above the top opening 108B, from falling into the guiding channel 108, and therefore onto the electrical equipment 106.

It will be noted that, in the preceding examples, the guiding channel 108 lacks openings other than the top 108B and bottom 108A openings, in order to definitely channel the heat transfer fluid.

The invention claimed is:

1. An electric module intended to be submerged underwater, comprising: a sealed enclosure intended to be submerged underwater and containing an atmosphere comprising a heat transfer fluid defining a secondary fluid; at least one item of electrical equipment arranged in the sealed enclosure and, in operation, heating the atmosphere; a secondary cooling circuit, for cooling the at least one item of electrical equipment, using the secondary fluid, the secondary cooling circuit comprising: a guiding channel provided with a top opening and a bottom opening below the top opening, the guiding channel being arranged in the sealed enclosure so as to guide the atmosphere heated by the at least one item of electrical equipment towards the top opening; a passage for the atmosphere, the passage linking the top opening to the bottom opening via the outside of the guiding channel and being delimited, at least partly, by the sealed enclosure in order to provide a cooling of the atmosphere upon contact with the sealed enclosure; the guiding channel being thermally isolated from the sealed enclosure.

2. The electric module as recited in claim 1 further comprising members linking the guiding channel to the sealed enclosure, the members being thermal conduction insulators having a thermal conductivity of less than or equal to 1 $W \cdot m^{-1} \cdot K^{-1}$.

3. The electric module as recited in claim 1 wherein the at least one item of electrical equipment has a power level higher than 10 kVA.

4. The electric module as recited in claim 3 wherein the power level is higher than 1 MVA.

5. The electric module as recited in claim 3 wherein all the items of the at least one item of electrical power equipment are arranged in the guiding channel between the top opening and the bottom opening.

6. The electric module as recited in claim 1 further comprising a primary cooling circuit for cooling the at least one item of electrical equipment using a primary fluid.

7. The electric module as recited in claim 6 wherein the primary fluid is water.

8. The electric module as recited in claim 6 wherein the sealed enclosure has a bottom for collecting, after escape from the primary circuit, the primary fluid in liquid form after condensation on the enclosure and further comprising a pump for retrieving the primary fluid collected at the bottom of the sealed enclosure and for re-injecting the collected primary fluid into the primary circuit.

9. The electric module as recited in claim 8 further comprising a bottom roof covering the bottom of the sealed enclosure, the bottom roof being thermally linked to the sealed enclosure.

10. The electric module as recited in claim 8 further comprising a non-return system arranged between the pump and the primary circuit and intended to prevent a flow of the primary fluid from the primary circuit towards the pump.

11. The electric module as recited in claim 10 wherein the non-return system includes a check valve or a solenoid valve.

12. The electric module as recited in claim 1 further comprising a heating system intended to heat the atmosphere in the guiding channel at least intermittently.

13. The electric module as recited in claim 12 wherein the heating system is electrical-resistance based.

14. The electric module as recited in claim 12 further comprising a moisture sensor intended to supply a measurement of moisture in the guiding channel, the heating system being intended to stop heating when the measurement passes below a predetermined threshold, and otherwise the heating system is intended to provide heat.

15. The electric module as recited in claim 12 wherein the heating system is arranged in the bottom half of the guiding channel.

16. The electric module as recited in claim 15 wherein the heating system is in the bottom opening of the guiding channel.

17. The electric module as recited in claim 1 wherein the guiding channel lacks an opening other than the top and bottom openings.

18. The electric module as recited in claim 1 wherein the guiding channel is cylindrical.

19. The electric module as recited in claim 1 further comprising a condensation fall preventer intended to prevent a falling of condensation from a part of the sealed enclosure located vertically from the at least one item of electrical equipment in a position of use of the electric module, onto the item or items of electrical equipment.

20. The electric module as recited in claim 1 wherein the at least one item of electrical equipment includes an electrical power converter.

21. The electric module as recited in claim 1 wherein the secondary fluid is air or nitrogen.

* * * * *